United States Patent
Kim et al.

(10) Patent No.: US 9,887,078 B2
(45) Date of Patent: Feb. 6, 2018

(54) SINGLE-WAFER-TYPE CLEANING APPARATUS

(71) Applicant: Samsung Electronics Co., Ltd., Suwon-si, Gyeonggi-do (KR)

(72) Inventors: Namsuk Kim, Yongin-si (KR); Ohhyung Kwon, Suwon-si (KR); Dae-Sung Kim, Yongin-si (KR); Jutaek Lim, Hwaseong-si (KR); Jaehyung Jung, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 69 days.

(21) Appl. No.: 14/983,530

(22) Filed: Dec. 29, 2015

(65) Prior Publication Data

US 2016/0197000 A1 Jul. 7, 2016

(30) Foreign Application Priority Data

Jan. 6, 2015 (KR) .................. 10-2015-0001264

(51) Int. Cl.
*B08B 3/00* (2006.01)
*H01L 21/02* (2006.01)
*H01L 21/67* (2006.01)
*H01L 21/687* (2006.01)

(52) U.S. Cl.
CPC .... *H01L 21/0209* (2013.01); *H01L 21/02041* (2013.01); *H01L 21/02057* (2013.01); *H01L 21/67028* (2013.01); *H01L 21/67051* (2013.01); *H01L 21/68792* (2013.01)

(58) Field of Classification Search
None
See application file for complete search history.

(56) References Cited

U.S. PATENT DOCUMENTS

| 8,830,650 | B2 | 9/2014 | Suzuki et al. |
| 8,885,316 | B2 | 11/2014 | Sato et al. |
| 2009/0126760 | A1* | 5/2009 | Banerjee .................. B08B 3/02 134/1 |

FOREIGN PATENT DOCUMENTS

| JP | 2013026568 A | 2/2013 |
| KR | 1020010010036 A | 2/2001 |
| KR | 1020020037557 A | 5/2002 |
| KR | 1020070106834 A | 11/2007 |
| KR | 100872670 | 12/2008 |
| KR | 1020110065401 A | 6/2011 |
| KR | 101059228 | 8/2011 |
| KR | 101077289 | 10/2011 |
| KR | 101398396 | 5/2014 |

* cited by examiner

*Primary Examiner* — Eric Golightly
(74) *Attorney, Agent, or Firm* — Renaissance IP Law Group LLP

(57) ABSTRACT

A single-wafer-type cleaning apparatus is provided. The single-wafer-type cleaning apparatus is configured to be capable of controlling electrostatic charges generated due to rotating a wafer during a semiconductor cleaning process and a defect caused by the electrostatic charges. The cleaning process uses an ionizer mounted on a chuck.

20 Claims, 9 Drawing Sheets

SINGLE-WAFER-TYPE CLEANING APPARATUS

CROSS-REFERENCE TO RELATED APPLICATION

This application claims priority under 35 U.S.C. § 119 to Korean Patent Application No. 10-2015-0001264 filed on Jan. 6, 2015, the disclosure of which is hereby incorporated by reference in its entirety.

BACKGROUND

Field

Embodiments of the inventive concepts relate to a single-wafer-type cleaning apparatus which cleans a wafer by rotating the wafer.

Description of Related Art

Generally, semiconductor devices are manufactured by repeatedly performing various unit processes such as deposition, photolithography, etching, polishing, and cleaning.

When these unit processes are performed, the cleaning process is performed to remove residues, small particles, contaminants, or unnecessary layers remaining on the surface of a wafer. Recently, the importance of the cleaning process has been further increased as a pattern formed on a wafer is miniaturized.

The cleaning process includes chemically or physically separating contaminants from a wafer, rinsing, and drying. In the cleaning process, circuits and/or films included in a wafer can be damaged when charges accumulated in the wafer are discharged.

SUMMARY

Example embodiments of the inventive concepts provide a single-wafer-type cleaning apparatus including an ionizer.

Example embodiments of the inventive concepts provide a wafer cleaning method which controls defects generated in a manufacturing process of a semiconductor device by controlling electrostatic charges generated in a single-wafer-type wafer cleaning process.

In accordance with example embodiments of the inventive concepts, a single-wafer-type cleaning apparatus may include a chamber, a chuck disposed in the chamber, an ionizer mounted on the chuck and configured to generate ions, at least one cleaning chemical dispensing nozzle disposed in the chamber, and a wafer fixing part disposed on the chuck.

In some embodiments, the ions generated from the ionizer may be emitted onto a back surface of a wafer fixed on the wafer fixing part to neutralize charged particles accumulated in the wafer.

In some embodiments, the ionizer may generate the ions using a corona method, a piezo high frequency alternating current (HF-AC) method, or an X-ray method.

In some embodiments, a voltage using a HF-AC or a pulsed AC method may be applied to the ionizer.

In some embodiments, ionizer may have at least one of a bar type, a ring type, and a radial type.

In some embodiments, the chuck may include a non-rotating body disposed at a center of the chuck and a rotating body configured to surround the non-rotating body.

In some embodiments, the ionizer may be mounted on the non-rotating body.

In some embodiments, the cleaning chemical dispensing nozzle may include a first cleaning chemical dispensing nozzle configured to spray a cleaning chemical onto a front surface of a wafer disposed on the fixed on the wafer fixing part.

In some embodiments, the cleaning chemical dispensing nozzle may include a second cleaning chemical dispensing nozzle configured to spray the cleaning chemical onto the back surface of the wafer.

In some embodiments, the single-wafer-type cleaning apparatus may further include an air supplier injecting air toward the front surface of the wafer.

In some embodiments, the chuck may further include a ground peak being in contact with a wafer fixed on the wafer fixing part.

In accordance with example embodiments of the inventive concepts, a method for treating a wafer may include loading a wafer on a chuck including an ionizer mounted thereon, generating ions from the ionizer, emitting the ions onto a back surface of the wafer to neutralize charged particles accumulated in the wafer, and cleaning the wafer.

In some embodiments, cleaning the wafer may include spraying a cleaning chemical onto the wafer through at least one chemical dispensing nozzle.

In some embodiments, the chuck may include a rotating body and a non-rotating body, and the ionizer may be mounted on the non-rotating body.

In some embodiments, the single-wafer-type cleaning apparatus may rotate the wafer with the rotating body, and generate ions from the ionizer.

In accordance with example embodiments of the inventive concept, a single-wafer-type cleaning apparatus may include a chamber, a chuck disposed in the chamber and including a rotating body and a non-rotating body, a ionizer disposed on the non-rotating body and configured to generate ions, a wafer fixing part disposed on the rotating body, and a cleaning chemical spray part including a first cleaning chemical dispensing nozzle configured to spray cleaning chemical onto a front surface of the wafer disposed on the wafer fixing part.

In some embodiments, the single-wafer-type cleaning apparatus may include a second cleaning chemical dispensing nozzle disposed on the non-rotating body configured to spray a cleaning chemical onto the back surface of the wafer.

In some embodiments, the single-wafer-type cleaning apparatus may further include a conductive ground peak disposed on the rotating body and configured to contact the back surface of the wafer disposed on the wafer fixing part and a ground wire embedded in the chuck.

In some embodiments, the single-wafer-type cleaning apparatus may further include a motor and a motor shaft configured to rotate the rotating body, and the ground wire may be electrically connected to the motor shaft.

In some embodiments, the ground peak may include the wafer fixing part coated with a conductive material.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference numerals denote the same respective parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
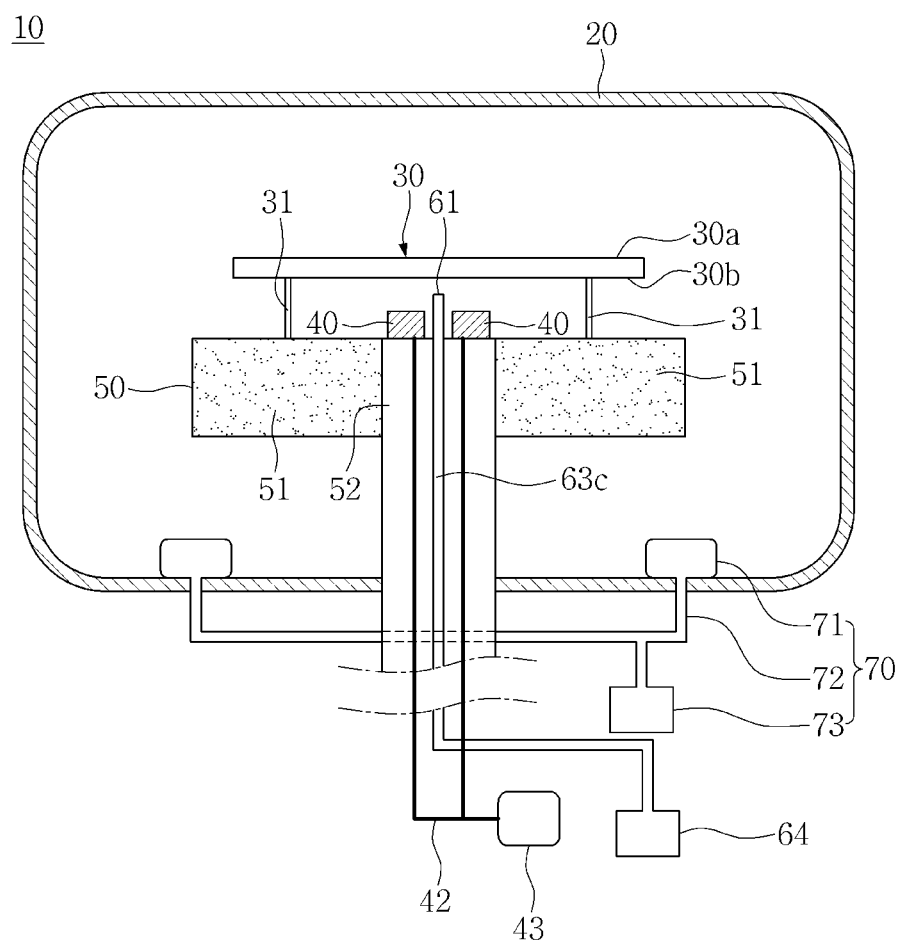
FIGS. 1 and 6 through 8 are cross sectional views respectively illustrating single-wafer-type cleaning apparatuses according to example embodiments of the inventive concepts.

Advantages and features of the inventive concepts and methods of achieving the same will be clearly understood with reference to the accompanying drawings and the following detailed embodiments. However, the inventive concepts are not limited to the embodiments to be disclosed, but may be implemented in various different forms. The embodiments are provided in order to fully explain the inventive concepts and fully explain the scope of the inventive concepts to those skilled in the art. Accordingly, the scope of the inventive concepts is defined by the appended claims.

The terminology used here is for describing particular example embodiments only and is not intended to be limiting. As used here, the singular forms "a," "an," and "the" are intended to include plural forms as well unless the context clearly indicates otherwise.

It will be further understood that the terms "comprises," "comprising," "includes," and/or "including" when used in this specification, specify the presence of stated features, integers, steps, operations, elements, and/or components, but do not preclude the presence or addition of one or more other features, integers, steps, operations, elements, and/or components.

The example embodiments of the inventive concepts will be described with reference to cross-sectional views and/or plan views which are ideal exemplary views. In the drawings, elements and thicknesses of areas are exaggerated for effective illustrations of the technical concept. Forms of the embodiments may be modified by the manufacturing technology and/or tolerance. Therefore, the embodiments of the invention are not intended to be limited to illustrated specific forms, and include modifications of forms generated according to the manufacturing processes. For example, an area illustrated as a rectangle will, typically, have rounded or curved features. Therefore, areas illustrated in the drawings have overview properties, shapes of the areas are illustrated special forms of the areas of a device, and are not intended to limit the scope of the inventive concepts.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

FIG. 1 is a cross sectional view illustrating schematically a single-wafer-type cleaning apparatus according to example embodiments of the inventive concepts. FIGS. 2 through 5 are top views respectively illustrating various types of ionizers mounted on chucks of the single-wafer-type cleaning apparatuses according to example embodiments of the inventive concepts.

Referring to FIGS. 1 and 2 through 5, the single-wafer-type cleaning apparatus 10 according to the example embodiments of the inventive concepts may include a chamber 20, a chuck 50 disposed in the chamber 20, ionizers 40 disposed on the chuck 50, and a wafer fixing part 31 disposed on the chuck 50. The chuck 50 may include a non-rotating body 52 disposed at the center of the chuck and a rotating body 51 surrounding the non-rotating body 52. The rotating body 51 may have an annular or disk shape, and the non-rotating body 52 may have a circle or disk shape.

The single-wafer-type cleaning apparatus 10 may further include a first cleaning chemical dispensing nozzle 61 disposed on the non-rotating body 52. The first cleaning chemical dispensing nozzle 61 may protrude from an upper surface of the non-rotating body 52 of the chuck 50. The first cleaning chemical dispensing nozzle 61 may spray a cleaning chemical on a back surface 30b of a wafer 30 disposed on the wafer fixing part 31.

In some embodiments, the wafer 30 may include at least one film formed on the front surface 30a of the wafer 30. The first cleaning chemical dispensing nozzle 61 may include an upper end part at a level lower than an upper end part of the wafer fixing part 31.

The first cleaning chemical dispensing nozzle 61 may be spaced apart from the wafer 30. The cleaning chemical may comprise various types of chemicals according to a cleaning or etching process. For example, the cleaning chemical may include ammonia ($NH_4OH$), hydrogen peroxide ($H_2O_2$), diluted hydrochloric acid (HCl), diluted sulfuric acid ($H_2SO_4$), and diluted hydrofluoric acid (HF), or a combination thereof.

The cleaning chemical may be sprayed onto the center of the back surface 30b of the rotating wafer 30. The cleaning chemical may be entirely spread on the back surface 30b of the wafer 30 by centrifugal force.

The first cleaning chemical dispensing nozzle 61 may be connected to a first cleaning chemical supply pipe 63c passing through the non-rotating body 52. The first cleaning chemical supply pipe 63c may supply the cleaning chemical to the first cleaning chemical dispensing nozzle 61 from a cleaning chemical tank 64 located outside of the chamber 20.

The ionizer 40 may be mounted on the chuck 50. For example, the ionizer 40 may be mounted on the non-rotating body 52. The ionizer 40 may be connected to an ionizer controller 43 located outside of the chamber 20 through a voltage supply wire 42 passing through the non-rotating body 52 of the chuck 50.

The ionizer controller 43 denotes all devices which may adjust the voltage supply state of the ionizer 40. The ionizer 40 may generate ions using a corona method, a piezo high frequency alternating current (HF-AC) method, or an X-ray method. The ionizer 40 may be applied with a voltage using a HF-AC or pulsed AC method.

The ionizer 40 may be driven to the extent where an amount of charge of a charged object (e.g., a wafer) is offset, may be detached from, mounted on, or fixed on the upper surface of the chuck 50, and may be made in the required shape.

Figure 2:
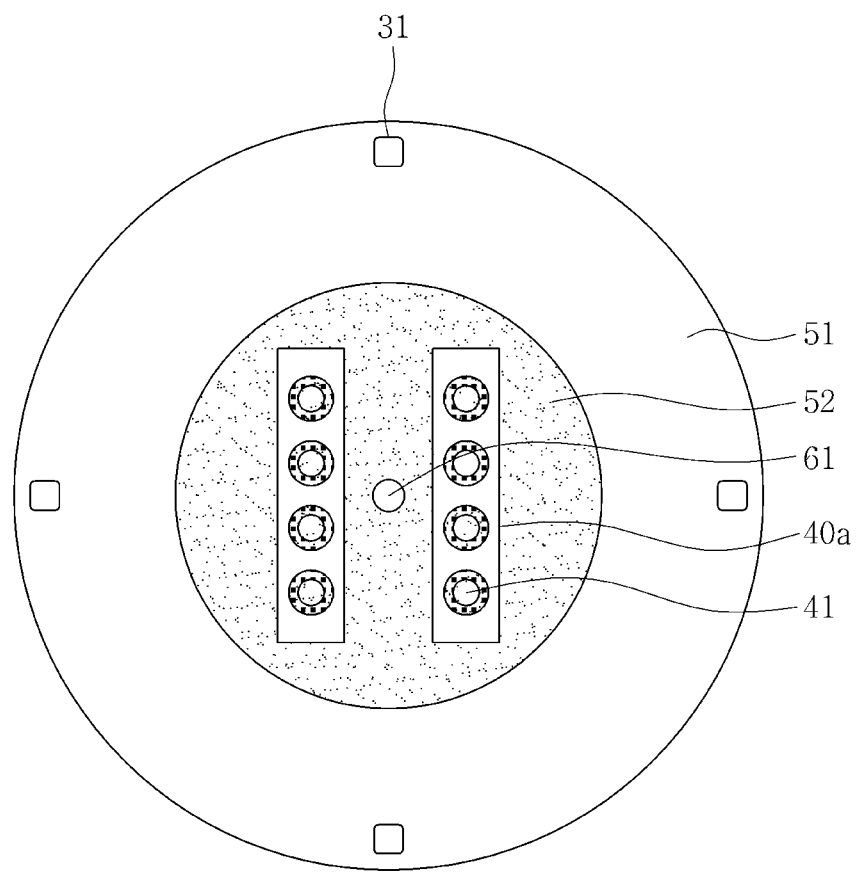
FIGS. 2 through 5 are top views respectively illustrating various types of ionizers mounted on chucks of single-wafer-type cleaning apparatuses according to example embodiments of the inventive concepts.

As shown in FIG. 2, the ionizer 40 may include a bar-type ionizer 40a. The bar-type ionizer 40a may be mounted on the non-rotating body 52 of the chuck 50.

When the wafer 30 is fixed on the chuck 50 by the wafer fixing part 31, the bar-type ionizer 40a may generate ions through an ion generating part 41 when the rotating body 51 rotates. The ions generated from the bar-type ionizer 40a may be emitted toward the back surface 30b of the wafer 30.

For example, the ions may move to the back surface 30b of the wafer 30 along with a rotating air flow and/or an upstream air flow according to the rotation of the wafer 30. The ions generated from the ionizer 40a may move toward an outside of the wafer from a center of the back surface 30b of the wafer 30. Such movement has the positive effect of effectively neutralizing charged particles of which an amount of charge increases closer to the center of the wafer 30 as the wafer 30 is rotated rapidly.

The upstream air flow may include a fluid flow pattern such as a vertical upstream air flow, a directional air flow, and a helical air flow.

The bar-type ionizers 40a may be disposed at both sides of the first cleaning chemical dispensing nozzle 61.

Figure 3:
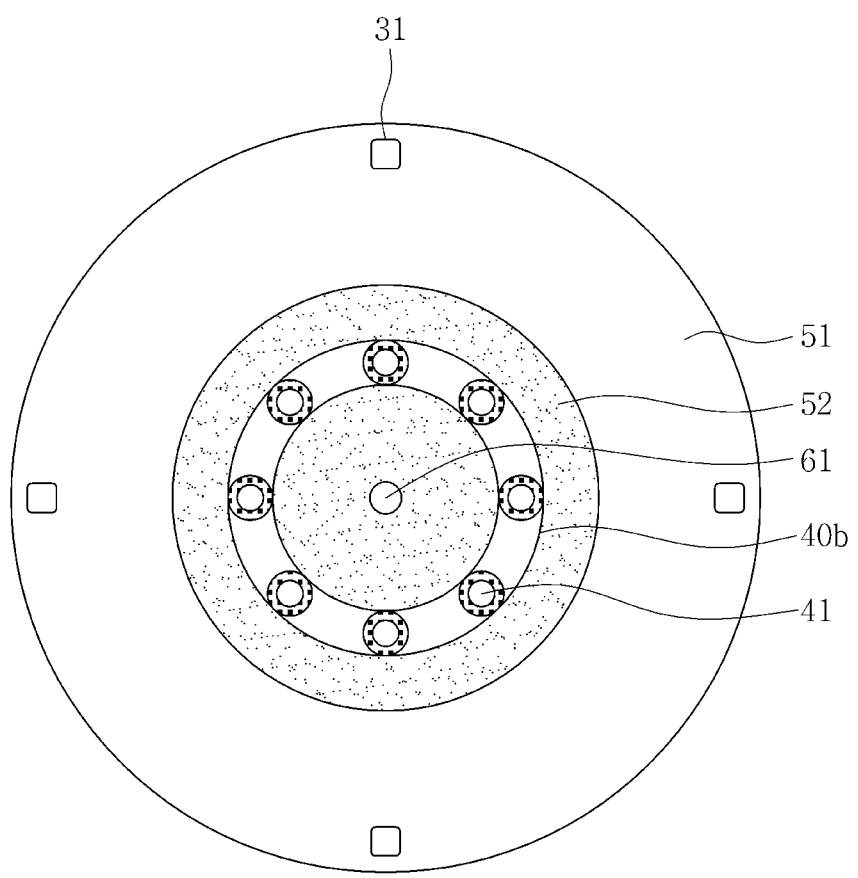

In some embodiments, as shown in FIG. 3, the ionizer 40 may include a ring-type ionizer 40b. The ring-type ionizer 40b may be mounted on the non-rotating body 52 of the chuck 50. The first cleaning chemical dispensing nozzle 61 may be the center point of the ring-type ionizer 40b.

Figure 4:
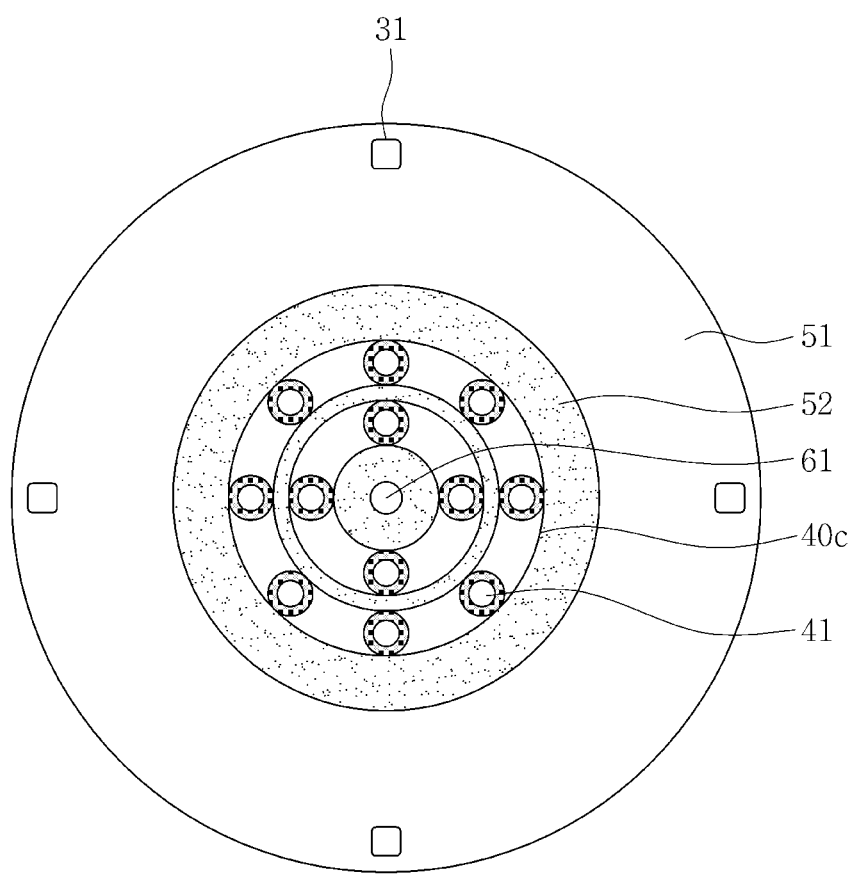

In some embodiments, as shown in FIG. 4, the ionizer 40 may include a plurality of ring-type ionizers 40c. The plurality of the ring-type ionizers 40c may have a shape in which a plurality of ring shapes having different diameters are concentrically disposed around the first cleaning chemical dispensing nozzle 61. Although FIG. 4 shows the ionizer 40c in which two ring-type ionizers having different diameters are concentrically disposed, the ionizer 40c may have a shape in which three or more ring-type ionizers are concentrically disposed.

Figure 5:
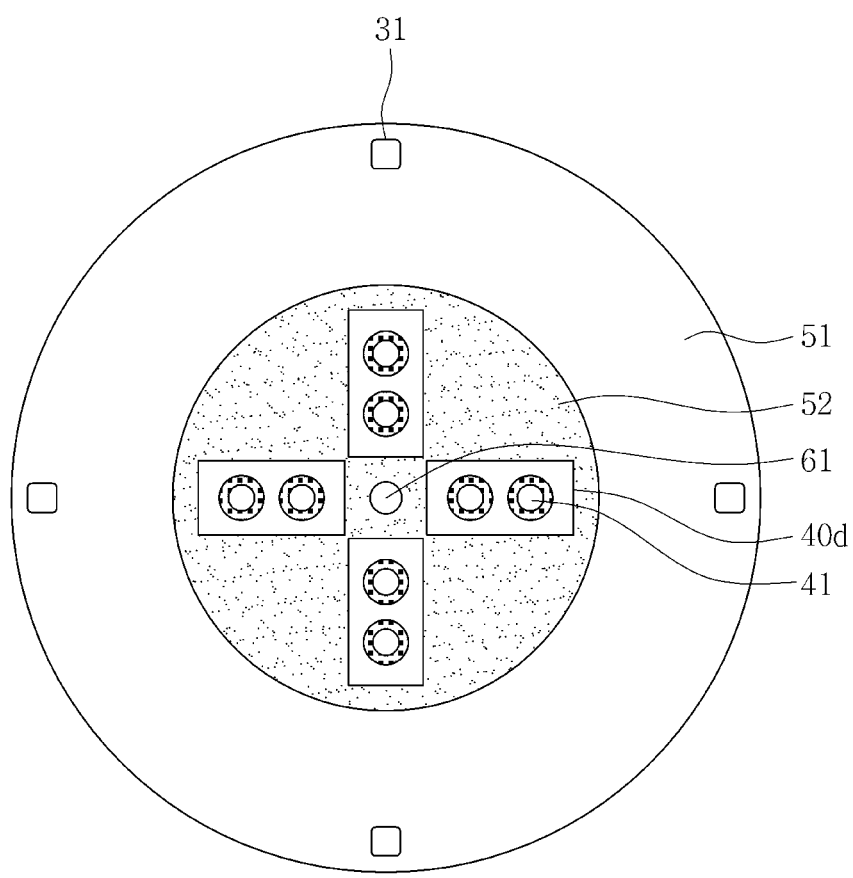

In some embodiments, as shown in FIG. 5 the ionizer 40 may include a radial-type ionizer 40d. The radial-type ionizer 40d may be mounted on the non-rotating body 52 of the chuck 50. The radial-type ionizer 40d may include the plurality of bar-type ionizers 40a radially disposed around the first cleaning chemical dispensing nozzle 61.

Although FIG. 5 shows the ionizer 40d having a shape in which 4 bars are radially disposed, at least three bars may be radially disposed around the first cleaning chemical dispensing nozzle 61.

The single-wafer-type cleaning apparatus 10 may further include a cleaning chemical recovery part 70 recovering the cleaning chemical leaving the wafer 30 when the wafer 30 rotates with the rotating body 51 in the chamber 20.

The cleaning chemical recovery part 70 may include a cleaning chemical recovering body 71. The cleaning chemical recovering body 71 may be a device to recover and drain the cleaning chemical leaving the wafer 30.

The cleaning chemical recovering body 71 may be connected to a cleaning chemical storage part 73 through a cleaning chemical recovering pipe 72. The cleaning chemical recovering pipe 72 may pass through the chamber 20 and be connected to the cleaning chemical storage part 73 disposed outside of the chamber 20.

Figure 6:
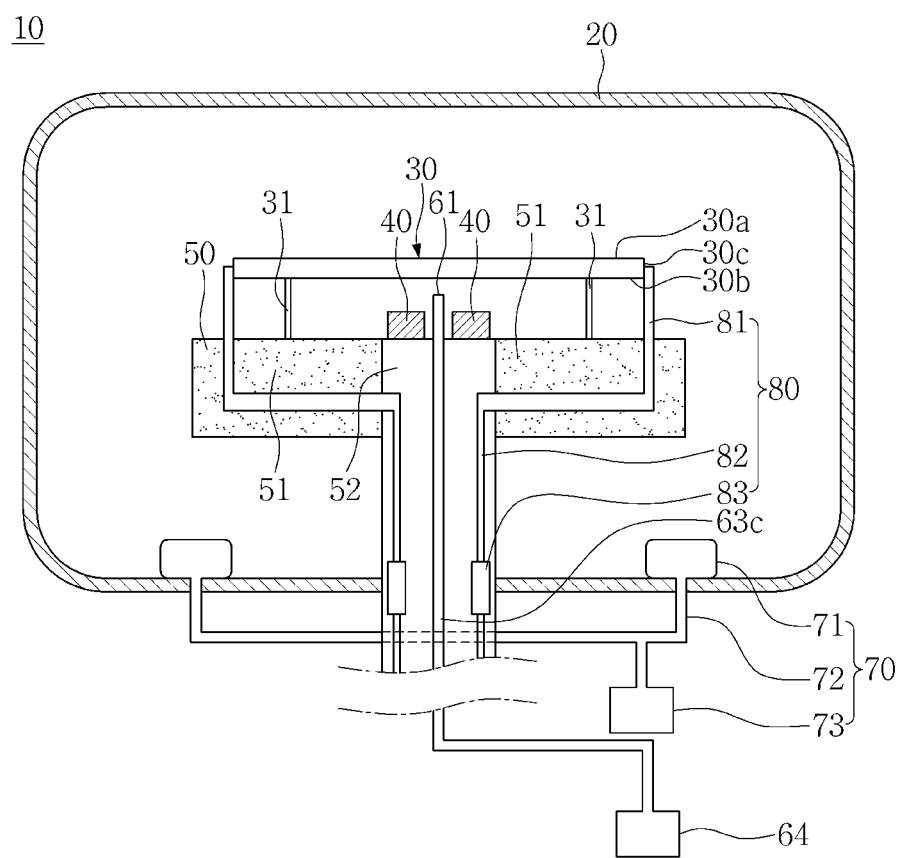

Referring to FIG. 6, the single-wafer-type cleaning apparatus 10 according to the example embodiments of the inventive concepts may further include a ground part 80.

The ground part 80 may include a ground peak 81, a ground wire 82, and a motor shaft 83. The ground peak 81 may be disposed at the side of the rotating body 51 of the chuck 50, and may protrude from the surface of the rotating body 51.

The ground peak 81 may contact a side surface 30c of the wafer 30, and may be electrically connected to the motor shaft 83 through the ground wire 82. The chuck 50 may further include a motor (not shown) and the motor shaft 83 for rotating the rotating body 51.

The ground wire 82 may be embedded inside of the chuck 50. The ground peak 81 may include carbon, silicon, or a metal. The ground wire 82 and the motor shaft 83 may include a conductive material.

The ground peak 81 may be in contact with a back surface 30b of the wafer 30. In some embodiments, the ground peak 81 may include the wafer fixing part 31 coated with a conductive material.

Figure 7:
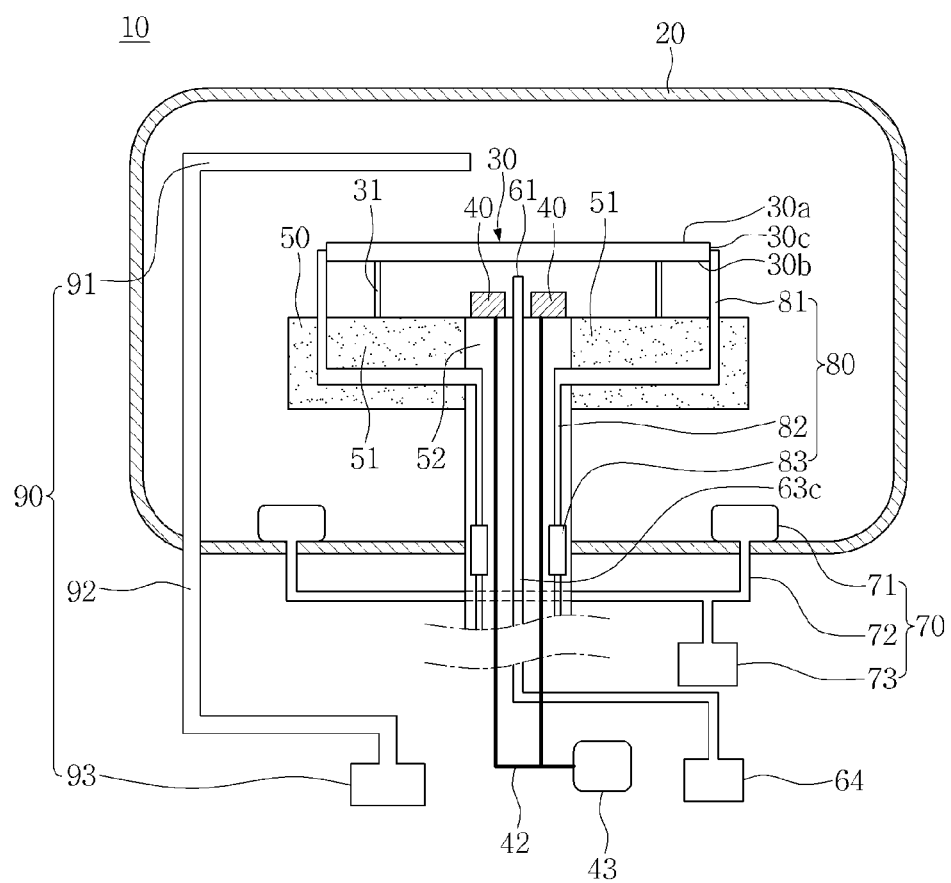

Referring to FIG. 7, the single-wafer-type cleaning apparatus 10 according to the example embodiments of the inventive concepts may include an air supplier 90 including an air injecting part 91 jetting air in the chamber 20.

The air injecting part 91 may be spaced apart from the wafer 30, and may inject air toward the front surface 30a, the side surface 30c, or the back surface 30b of the wafer 30. Ions generated from the ionizer 40 and emitted toward the back surface 30b of the wafer 30 may be moved by riding the air flow injected from the air jet 91.

The air injecting part 91 may be located inside of the chamber 20, pass through the chamber 20, and be connected to an air storage part 93 outside of the chamber 20 through an air supplying pipe 92. The air may include $N_2$. The air may accelerate drying of the wafer 30.

Figure 8:
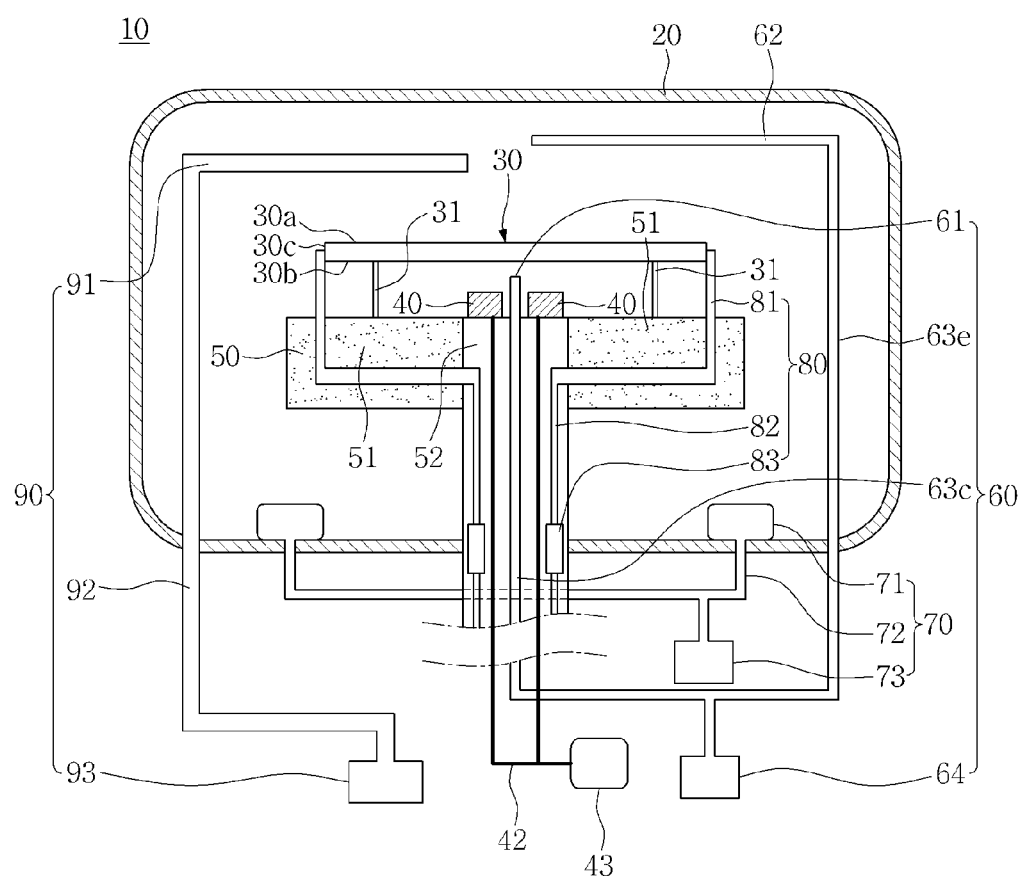

Referring to FIG. 8, the single-wafer-type cleaning apparatus 10 according to the example embodiments of the inventive concepts may further include a second cleaning chemical dispensing nozzle 62 for spraying a cleaning chemical on the front surface 30a of the wafer 30.

The second cleaning chemical dispensing nozzle 62 may be connected to an outside cleaning chemical tank 64 outside of the chamber 20 through a second cleaning chemical supply pipe 63e. The first cleaning chemical dispensing nozzle 61 and the first cleaning chemical supply pipe 63c may share the cleaning chemical tank 64 located outside of the chamber 20 along with the second cleaning chemical dispensing nozzle 62 and the second cleaning chemical supply pipe 63e.

The chuck 50 in which an ionizer 40 of the single-wafer-type cleaning apparatus 10 according to the example embodiments of the inventive concepts is mounted may be applied to other types of single-wafer-type processing apparatuses (e.g., a coating apparatus, a thermal processing apparatus, or a polishing apparatus).

Figure 9:
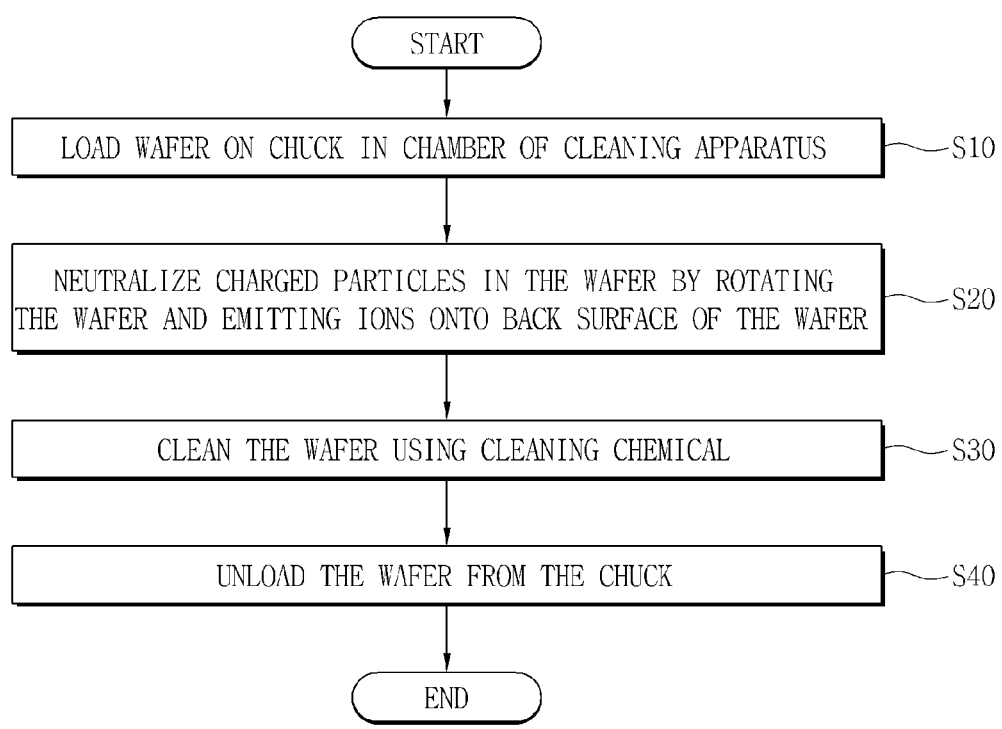
FIG. 9 is a flow chart illustrating a wafer cleaning method using the single-wafer-type cleaning apparatus according to example embodiments of the inventive concepts.

FIG. 9 is a flow chart showing a wafer cleaning method using the wafer cleaning apparatus of FIG. 1 through 8 according to example embodiments of the inventive concepts.

Referring to FIG. 9, the wafer cleaning method according to the example embodiments of the inventive concepts may include loading a wafer 30 on the chuck 50 inside of the chamber of the cleaning apparatus 10 (S10). For example, the wafer 30 including at least one film formed on the front surface 30a thereof may be disposed on the wafer fixing part 31 of the chuck 50.

The method may include rotating the wafer 30, emitting ions to the back surface 30b of the wafer 30, and neutralizing charged particles accumulated in the wafer 30 (S20). For example, the wafer 30 is rotated by rotating the rotating body 51 of the chuck 50, ions generated from the ionizer 40 mounted on the non-rotating body 52 of the chuck 50 including the rotating body 51 and the non-rotating body 52 are emitted to a back surface 30b of the wafer 30 by rotating the wafer 30, and charged particles embedded in the films of the wafer 30 may be neutralized. The ionizer 40 may have one of the shapes shown in FIGS. 2 through 5.

The method may include cleaning the wafer 30 using a cleaning chemical (S30). For example, the wafer 30 may be cleaned by spraying a cleaning chemical on the front surface 30a and/or the back surface 30b of the wafer 30 through the first and/or second cleaning chemical dispensing nozzles 61 and/or 62. Although the process of generating ions and the process of spraying a cleaning chemical may be performed simultaneously, it is not limited to this. In some embodiments, the process of generating ions may be started first, and then the process of generating ions and the process of spraying a cleaning chemical may be performed simultaneously.

The method may include unloading the cleaned wafer 30 from the chuck 50 (S40). For example, the method may include unloading the cleaned wafer 30 from the wafer fixing part 31 on the chuck 50. The unloaded wafer 30 may be transferred to the outside of the chamber 20.

The cleaning chamber and/or the cleaning apparatus including a cleaning chamber according to example embodiments of the inventive concepts may be configured to effectively remove charged particles which are further accumulated at the center of the wafer when the wafer cleaning process is performed and thus, a defect rate in at least one film at the front side of the wafer due to electrostatic discharging of charged particles can be reduced.

Although a few embodiments have been described, those skilled in the art will readily appreciate that many modifications are possible without materially departing from the novel teachings and advantages. Accordingly, all such modifications are intended to be included within the scope of these inventive concepts as defined in the claims.

What is claimed is:

1. A single-wafer-type cleaning apparatus comprising:
a chamber;
a chuck disposed in the chamber;
an ionizer mounted on the chuck and configured to generate ions;
at least one cleaning chemical dispensing nozzle disposed in the chamber; and
a wafer fixing part disposed on the chuck.

2. The single-wafer-type cleaning apparatus of claim 1, wherein the ions generated from the ionizer are emitted to a back surface of a wafer disposed on the wafer fixing part to neutralize charged particles accumulated in the wafer.

3. The single-wafer-type cleaning apparatus of claim 2, wherein the ionizer generates the ions using a corona method, a piezo high frequency alternating current (HF-AC) method, or an X-ray method.

4. The single-wafer-type cleaning apparatus of claim 3, wherein a voltage using a HF-AC or pulsed AC method is applied to the ionizer.

5. The single-wafer-type cleaning apparatus of claim 1, wherein the ionizer has at least one of a bar type, a ring type, a plurality of ring types, and a radial type.

6. The single-wafer-type cleaning apparatus of claim 1, wherein the chuck includes a non-rotating body disposed at a center of the chuck and a rotating body configured to surround the non-rotating body.

7. The single-wafer-type cleaning apparatus of claim 6, wherein the ionizer is mounted on the non-rotating body.

8. The single-wafer-type cleaning apparatus of claim 1, wherein the cleaning chemical dispensing nozzle includes a first cleaning chemical dispensing nozzle configured to spray a cleaning chemical onto a front surface of a wafer disposed on the wafer fixing part.

9. The single-wafer-type cleaning apparatus of claim 8, wherein the cleaning chemical dispensing nozzle includes a second cleaning chemical dispensing nozzle configured to spray the cleaning chemical onto a back surface of the wafer.

10. The single-wafer-type cleaning apparatus of claim 8, further comprising an air supplier injecting air toward the front surface of the wafer.

11. The single-wafer-type cleaning apparatus of claim 1, wherein the chuck further includes a ground peak being in contact with a wafer disposed on the wafer fixing part.

12. The single-wafer-type cleaning apparatus of claim 11, wherein the ground peak includes a conductive material.

13. A wafer cleaning method comprising: providing a single-wafer-type cleaning apparatus comprising: a chamber; a chuck disposed in the chamber; an ionizer mounted on the chuck and configured to generate ions; at least one cleaning chemical dispensing nozzle disposed in the chamber; and a wafer fixing part disposed on the chuck;
loading a wafer on the chuck;
generating ions from the ionizer;
emitting the ions onto a back surface of the wafer to neutralize charged particles accumulated in the wafer; and
cleaning the wafer.

14. The method of claim 13, wherein the cleaning of the wafer includes spraying a cleaning chemical onto the wafer through at least one chemical dispensing nozzle.

15. The method of claim 13, wherein the chuck includes a rotating body and a non-rotating body, and the ionizer is mounted on the non-rotating body.

16. The method of claim 15, wherein the wafer is rotated with the rotating body and ions generated from the ionizer are emitted.

17. A single-wafer-type cleaning apparatus comprising:
a chamber;
a chuck disposed in the chamber and including a rotating body and a non-rotating body;
an ionizer mounted on the non-rotating body and configured to generate ions;
a wafer fixing part disposed on the rotating body; and
a cleaning chemical supply part including a first cleaning chemical dispensing nozzle configured to spray a cleaning chemical onto a front surface of a wafer disposed on the wafer fixing part.

18. The single-wafer-type cleaning apparatus of claim 17 further comprising a second cleaning chemical dispensing nozzle disposed on the non-rotating body and configured to spray a cleaning chemical onto a back surface of the wafer.

19. The single-wafer-type cleaning apparatus of claim 17, further comprising:
a conductive ground peak disposed on the rotating body and configured to contact a back surface of the wafer disposed on the wafer fixing part; and
a ground wire embedded in the chuck.

20. The single-wafer-type cleaning apparatus of claim 17, wherein the ground peak includes the wafer fixing part coated with a conductive material.

* * * * *